(12) United States Patent
Liu et al.

(10) Patent No.: US 10,734,608 B2
(45) Date of Patent: Aug. 4, 2020

(54) DISPLAY PANEL AND MANUFACTURING METHOD THEREOF AND DISPLAY DEVICE INCLUDING DISPLAY PANEL

(71) Applicant: BOE TECHNOLOGY GROUP CO., LTD., Beijing (CN)

(72) Inventors: Libin Liu, Beijing (CN); Zheng Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 86 days.

(21) Appl. No.: 16/107,676

(22) Filed: Aug. 21, 2018

(65) Prior Publication Data
US 2019/0173054 A1 Jun. 6, 2019

(30) Foreign Application Priority Data
Dec. 5, 2017 (CN) .......................... 2017 1 1265592

(51) Int. Cl.
*H01L 51/52* (2006.01)
*H01L 51/56* (2006.01)
(Continued)

(52) U.S. Cl.
CPC ........ *H01L 51/5256* (2013.01); *G06F 3/0412* (2013.01); *H01L 27/1214* (2013.01);
(Continued)

(58) Field of Classification Search
CPC . H01L 51/5256; H01L 51/56; H01L 27/3279; H01L 27/3258; H01L 27/1214;
(Continued)

(56) References Cited

U.S. PATENT DOCUMENTS 9,087,800 B2 7/2015 Jung
9,735,389 B2 8/2017 Lee
(Continued)

FOREIGN PATENT DOCUMENTS

CN 204289455 U 4/2015
CN 104716156 A 6/2015
(Continued)

OTHER PUBLICATIONS

Chinese Office Action dated Oct. 9, 2019, from application No. 201711265592.X.

*Primary Examiner* — Joseph L Williams
*Assistant Examiner* — Jose M Diaz
(74) *Attorney, Agent, or Firm* — Foley & Lardner LLP

(57) ABSTRACT

The present disclosure discloses a display panel, which includes a thin-film transistor arranged on a substrate, an electroluminescent diode arranged on the thin-film transistor, which includes a bottom electrode, a light emitting layer, and a top electrode, and a thin-film encapsulation layer covering the electroluminescent diode. The display panel further includes an auxiliary electrode and a lead wire of the top electrode of the electroluminescent diode. The auxiliary electrode is electrically connected to the lead wire of the top electrode of the electroluminescent diode by penetrating through a via hole of the thin-film encapsulation layer. Arrangements of the present disclosure provide a display panel and a manufacturing method thereof and a display device including the display panel.

13 Claims, 6 Drawing Sheets

(51) Int. Cl.
  *G06F 3/041* (2006.01)
  *H01L 27/12* (2006.01)
  *H01L 27/32* (2006.01)

(52) U.S. Cl.
  CPC ...... *H01L 27/3258* (2013.01); *H01L 27/3279* (2013.01); *H01L 51/56* (2013.01); *G06F 2203/04103* (2013.01); *H01L 27/323* (2013.01)

(58) Field of Classification Search
  CPC .............. H01L 27/323; H01L 27/1248; H01L 2021/775; H01L 21/77; G06F 3/0412; G06F 2203/04103; G06F 1/1333
  See application file for complete search history.

(56) References Cited

U.S. PATENT DOCUMENTS

| | | | |
|---|---|---|---|
| 9,799,710 | B2 | 10/2017 | Lee et al. |
| 2003/0227021 | A1 | 12/2003 | Yamazaki et al. |
| 2016/0035803 | A1 | 2/2016 | Kim et al. |
| 2016/0172425 | A1* | 6/2016 | Lee .................... H01L 51/5228 257/40 |

FOREIGN PATENT DOCUMENTS

| | | |
|---|---|---|
| CN | 104851903 A | 8/2015 |
| CN | 104867955 A | 8/2015 |
| CN | 105261632 A | 1/2016 |
| CN | 105870151 A | 8/2016 |
| CN | 106887523 A | 6/2017 |

\* cited by examiner

DISPLAY PANEL AND MANUFACTURING METHOD THEREOF AND DISPLAY DEVICE INCLUDING DISPLAY PANEL

CROSS REFERENCE TO RELATED APPLICATIONS

This application is based upon and claims priority to Chinese Patent Application No. 201711265592.X, filed on Dec. 5, 2017, the entire contents thereof are incorporated herein by reference.

TECHNICAL FIELD

The present disclosure relates to the field of display technologies, and more particularly, to a display panel and a manufacturing method thereof and a display device including the display panel.

BACKGROUND

Electroluminescent devices are light and thin in design, high in contrast and bright in color, and thus have dominated an increasingly significant share in the market of mobile communication display since 2010. In recent years, application of bendable, lightweight and portable flexible display devices made from flexible substrates particularly strengthen competitive advantages of electroluminescent display products, such that it is believed that the electroluminescent devices have a trend of replacing liquid crystal display (LCD) in the mobile intelligent terminal (mobile phone) application market. Slim bezel or narrow border electroluminescent devices are especially welcome.

SUMMARY

A first aspect of the present disclosure provides a display panel, which includes a thin-film transistor arranged on a substrate, an electroluminescent diode arranged on the thin-film transistor, which includes a bottom electrode, a light emitting layer, and a top electrode, and a thin-film encapsulation layer covering the electroluminescent diode.

The display panel further includes an auxiliary electrode. The auxiliary electrode is electrically connected to a lead wire of the top electrode of the electroluminescent diode by penetrating through a via hole of the thin-film encapsulation layer.

In an arrangement the auxiliary electrode is arranged on the thin-film encapsulation layer and is electrically connected to the lead wire of the top electrode of the electroluminescent diode by penetrating through the via hole of the thin-film encapsulation layer.

In an arrangement the display panel includes a touch module formed on the thin-film encapsulation layer. The auxiliary electrode is formed on the touch module and is electrically connected to the lead wire of the top electrode of the electroluminescent diode by penetrating through the touch module and the via hole of the thin-film encapsulation layer.

In an arrangement the display panel includes two auxiliary electrodes.

One auxiliary electrode is arranged on the thin-film encapsulation layer and is electrically connected to the lead wire of the top electrode of the electroluminescent diode by penetrating through the via hole of the thin-film encapsulation layer.

The display panel further includes a touch module formed on the thin-film encapsulation layer. The other auxiliary electrode is formed on the touch module and is electrically connected to the lead wire of the top electrode of the electroluminescent diode by penetrating through the touch module and the via hole of the thin-film encapsulation layer.

In an arrangement the electroluminescent diode is of a top-emission type, and a material of the lead wire of the top electrode is ITO, or an ITO-Ag-ITO laminated layer, or metal smaller than the ITO in light transmittance but better matching a performance function of the light emitting layer of the electroluminescent diode.

Alternatively, the electroluminescent diode is of a bottom-emission type, and the material of the lead wire of the top electrode is metal better matching the performance function of the light emitting layer of the electroluminescent diode than the ITO.

In an arrangement the thin-film encapsulation layer includes a first inorganic thin-film encapsulation layer, a second organic thin-film encapsulation layer and a third inorganic thin-film encapsulation layer arranged in a direction far away from the electroluminescent diode. In an arrangement the first inorganic thin-film encapsulation layer and the third inorganic thin-film encapsulation layer extend farther in a direction parallel to a surface of the substrate than the second organic thin-film encapsulation layer extends in the direction far away from the electroluminescent diode, and the auxiliary electrode is electrically connected to the lead wire of the top electrode of the electroluminescent diode by penetrating through the first inorganic thin-film encapsulation layer and the third inorganic thin-film encapsulation layer.

In an arrangement a material of the auxiliary electrode is ITO or a Ti—Al—Ti laminated layer.

In an arrangement the display panel includes a drive circuit chip region. The auxiliary electrode is arranged deviating from the drive circuit chip region and encircles the display panel by 270°.

A second aspect of the present disclosure provides a display device, which includes the display panel according to the first aspect.

A third aspect of the present disclosure provides a method for manufacturing a display panel, which includes forming a thin-film transistor on a substrate, forming an electroluminescent diode on the thin-film transistor, the electroluminescent diode including a bottom electrode, a light emitting layer, and a top electrode, forming a thin-film encapsulation layer to cover the electroluminescent diode, and forming an auxiliary electrode. The auxiliary electrode is electrically connected to a lead wire of the top electrode of the electroluminescent diode by penetrating through a via hole of the thin-film encapsulation layer.

In an arrangement, the forming an auxiliary electrode includes forming the auxiliary electrode on the thin-film encapsulation layer. The auxiliary electrode is electrically connected to the lead wire of the top electrode of the electroluminescent diode by penetrating through the via hole of the thin-film encapsulation layer.

In an arrangement, after forming a thin-film encapsulation layer, the method includes forming a touch module on the thin-film encapsulation layer, and the forming an auxiliary electrode includes forming the auxiliary electrode on the touch module so that the auxiliary electrode is electrically connected to the lead wire of the top electrode of the electroluminescent diode by penetrating through the touch module and the via hole of the thin-film encapsulation layer.

In an arrangement the forming an auxiliary electrode includes forming an auxiliary electrode on the thin-film encapsulation layer, the auxiliary electrode being electrically connected to the lead wire of the top electrode of the electroluminescent diode by penetrating through the via hole of the thin-film encapsulation layer.

After forming an auxiliary electrode, the method includes forming a touch module on the thin-film encapsulation layer, and forming another auxiliary electrode on the touch module, the other auxiliary electrode being electrically connected to the lead wire of the top electrode of the electroluminescent diode by penetrating through the touch module and the via hole of the thin-film encapsulation layer.

In an arrangement the electroluminescent diode is of a top-emission type, and a material of the lead wire of the top electrode is ITO, or an ITO-Ag-ITO laminated layer, or metal smaller than the ITO in light transmittance but better matching a performance function of the light emitting layer of the electroluminescent diode.

Alternatively, the electroluminescent diode is of a bottom-emission type, and the material of the lead wire of the top electrode is metal better matching the performance function of the light emitting layer of the electroluminescent diode than the ITO.

In an arrangement the thin-film encapsulation layer includes a first inorganic thin-film encapsulation layer, a second organic thin-film encapsulation layer and a third inorganic thin-film encapsulation layer arranged in a direction far away from the electroluminescent diode.

BRIEF DESCRIPTION OF THE DRAWINGS

Further detailed description of specific arrangements of the present disclosure is made below with reference to the accompanying drawings.

DETAILED DESCRIPTION

Figure 1:
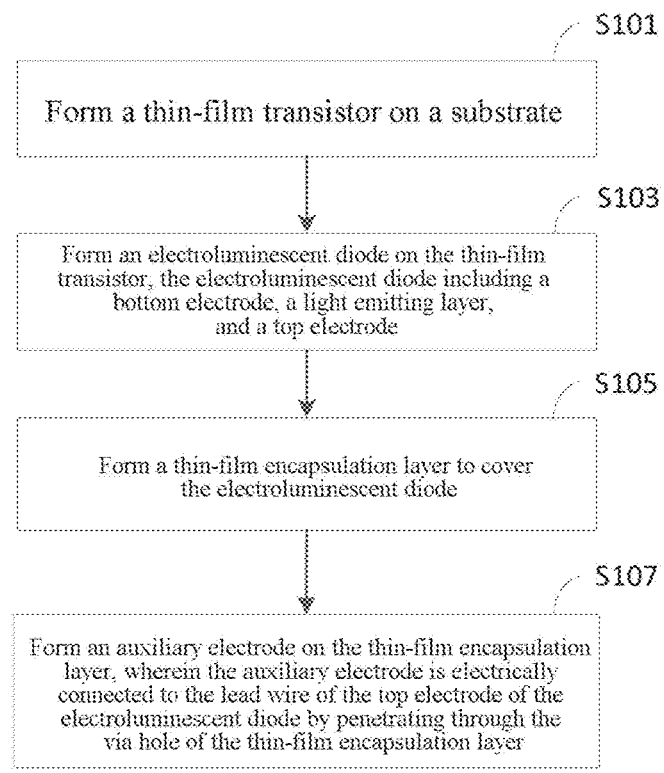
FIG. 1 illustrates a flowchart of preparing a display panel according to an arrangement of the present disclosure.

To more clearly describe the present disclosure, the present disclosure is further described below with reference to preferred arrangements and accompanying drawings. In these accompanying drawings, similar elements are represented by identical reference numerals. Those skilled in the art should understand that the following description is illustrative only and not restrictive, and should not be considered restrictive of the scope of protection of the present disclosure.

An electroluminescent diode of a display panel of an electroluminescent device in the arrangements of the present disclosure includes: an anode, a cathode, and a light emitting layer between the anode and the cathode. The electroluminescent diode may be of a normally-arranged type (that is, the anode is below while the cathode is above), or may be of an inverted-arranged type (that is, the anode is above while the cathode is below). For ease of description, reference is made to a top electrode and a bottom electrode of the electroluminescent diode in this arrangement. Those skilled in the art should understand that in the normally-arranged electroluminescent diode, the top electrode refers to the cathode, while the bottom electrode refers to the anode; whereas in the inverted-arranged electroluminescent diode, the top electrode refers to the anode, while the bottom electrode refers to the cathode.

In existing top-emission electroluminescent devices, light emitted from light-emitting layers penetrate through the top electrodes to display. To increase a light transmittance, generally ultrathin metal or metal oxides are used as the top electrodes. However, the attendant problem is that thin metal or a metal oxide layer has a high impedance value. In the process of driving the electroluminescent devices to emit light, larger voltage drop is caused by large resistance of top electrodes, such that the top electrodes may consume higher power in the case of a certain magnitude of electric current, which may cause increase of power consumption of the electroluminescent display devices and have a negative effect on operation of the electroluminescent display devices due to overheating of the top electrodes, thus worsening the display effect of the electroluminescent display devices and shortening the service life of electroluminescent display devices.

As shown in FIG. 1, an arrangement of the present disclosure provides a method for manufacturing a display panel, which includes following.

In S101, a thin-film transistor is formed on a substrate.

Figure 2:
FIG. 2-FIG. 6 illustrate sectional views corresponding to each stage in the flow of preparing the display panel according to an arrangement of the present disclosure.

In one example, as shown in FIG. 2, the substrate 10 may be glass or polyimide.

Figure 3:
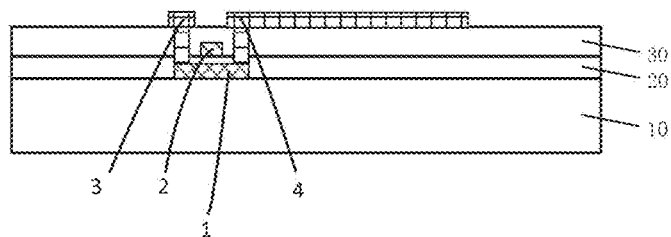

As shown in FIG. 3, forming a thin-film transistor on a substrate includes: successively preparing an active layer 1, a gate insulation layer 20, a gate 2, an interlayer insulation layer 30, a source 3 and a drain 4 on the substrate using conventional processes. Both the source 3 and the drain 4 are electrically connected to the active layer 1 through a via hole positioned on the gate insulation layer 20 and the interlayer insulation layer 30.

As can be seen, the display panel having a top gate structure is taken as an example in the above description. Nevertheless, those skilled in the art may understand that the solution of the present disclosure also may be applied to a display panel having a bottom gate structure. Those skilled in the art may design the top gate structure or the bottom gate structure according to actual needs, and may set a location of the active layer, which are not repeated any more herein for the sake of brevity.

In S103, an electroluminescent diode is formed on the thin-film transistor. The electroluminescent diode includes a bottom electrode, a light emitting layer, and a top electrode.

Figure 4:
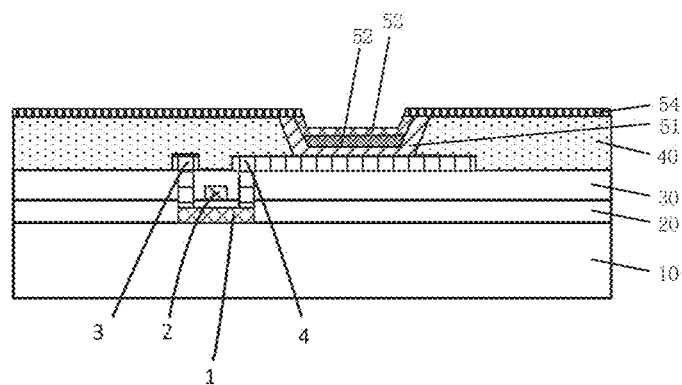

In one example, as shown in FIG. 4, forming an electroluminescent diode includes: forming a planarization layer 40 on the interlayer insulation layer 30, the source 3 and the drain 4, a via hole is provided in the planarization layer 40 and corresponding to above the drain 4, and a part of the drain 4 is exposed; depositing, in the via hole, a bottom electrode 51 of the electroluminescent diode electrically connected to the drain 4, and forming a light emitting layer 52 on the bottom electrode 51; and forming a top electrode 53 of the electroluminescent diode and a lead wire 54 of the top electrode on the light emitting layer 52 and the planarization layer 40.

In S105, a thin-film encapsulation layer is formed to cover the electroluminescent diode.

Figure 5:
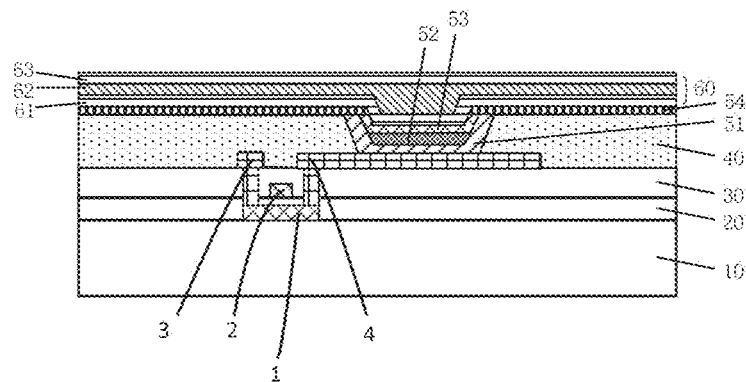

In one example, as shown in FIG. 5, a thin-film encapsulation layer 60 is formed on the top electrode 53 of the electroluminescent diode and the lead wire 54 of the top electrode.

In a preferable example, the thin-film encapsulation layer 60 includes a first inorganic thin-film encapsulation layer 61, a second organic thin-film encapsulation layer 62 and a third inorganic thin-film encapsulation layer 63 formed by using conventional evaporation processes.

In another preferable example, the first inorganic thin-film encapsulation layer and the third inorganic thin-film encapsulation layer extend farther in a direction parallel to a surface of the substrate than the second organic thin-film encapsulation layer.

Generally the thin-film encapsulation layer is designed in a manner where an inorganic layer and an organic layer are alternately arranged. The inorganic thin film generally is used as a waterproof layer because of its high water vapor isolation capability. However, defects (such as pinholes or cracks) generated in the process of forming the thin film reduce the air isolating capability, whereas overmany and overthick inorganic layers may generate a larger internal stress and thus have a negative effect on the encapsulation quality. The major roles of the organic planarization layer are to provide a base for performing planar thin film deposition for the subsequent inorganic waterproof layer and provide good particle wrapping effects. Furthermore, the defects and the stresses of the inorganic thin-film layers may be reduced by alternately arranging the organic layer and the inorganic layer. In this arrangement, a 3-thin-film encapsulation structure with inorganic layer-organic layer-inorganic layer alternately arranged is adopted. However, those skilled in the art should understand that the thin-film encapsulation structure also may be designed according to actual demands. For example, a multilayer thin-film encapsulation structure may be designed, and thickness of each thin-film encapsulation layer and size of coverage area may be designed according to the actual demands.

In S107, an auxiliary electrode is formed on the thin-film encapsulation layer. The auxiliary electrode is electrically connected to the lead wire of the top electrode of the electroluminescent diode by penetrating through the via hole of the thin-film encapsulation layer.

In a preferred arrangement, a material of the auxiliary electrode may be ITO or a Ti—Al—Ti laminated layer.

Figure 6:
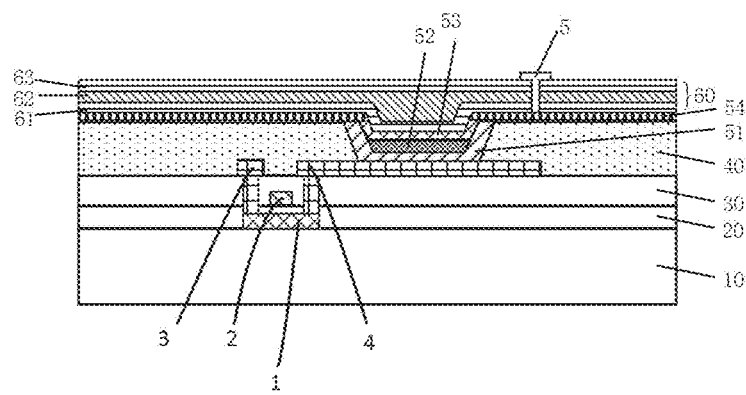

In one example, as shown in FIG. 6, forming a via hole and an auxiliary electrode 5 on the thin-film encapsulation layer includes: first etching the first inorganic thin-film encapsulation layer, the second organic thin-film encapsulation layer and the third inorganic thin-film encapsulation layer in a non-display area of the display panel by using a mask to form the via hole penetrating through the first inorganic thin-film encapsulation layer, the second organic thin-film encapsulation layer and the third inorganic thin-film encapsulation layer; then forming a metal layer on the third inorganic thin-film encapsulation layer 63 by using a chemical vapor deposition (CVD) process, the metal layer may be prepared by using a metallic material such as ITO or Ti/Al/Ti; and finally etching the metal layer by using the mask to form the auxiliary electrode 5. The auxiliary electrode 5 is electrically connected to the lead wire of the top electrode of the electroluminescent diode through the via hole.

In another preferable example, in case that the first inorganic thin-film encapsulation layer and the third inorganic thin-film encapsulation layer extend farther in a direction parallel to a surface of the substrate than the second organic thin-film encapsulation layer, an auxiliary electrode 5 is electrically connected to the lead wire of the top electrode of the electroluminescent diode by penetrating through the first inorganic thin-film encapsulation layer and the third inorganic thin-film encapsulation layer, without penetrating through the second organic thin-film encapsulation layer.

The display panel as shown in FIG. 6 is obtained through the above processing blocks, the display panel includes:

a thin-film transistor arranged on a substrate;

an electroluminescent diode arranged on the thin-film transistor, which includes a bottom electrode, a light emitting layer, and a top electrode; and a thin-film encapsulation layer 60 covering the electroluminescent diode.

The display panel further includes an auxiliary electrode 5 arranged on the thin-film encapsulation layer, the auxiliary electrode is electrically connected to the lead wire of the top electrode of the electroluminescent diode by penetrating through the via hole of the thin-film encapsulation layer.

In this arrangement, the auxiliary electrode is arranged on the thin-film encapsulation layer, and the auxiliary electrode is electrically connected to the lead wire of the top electrode of the electroluminescent diode by penetrating through the via hole of the thin-film encapsulation layer. That is, longitudinal parallel resistors are additionally provided, such that the overall resistance of the top electrode and the lead wire of the top electrode is effectively reduced, the display effect is improved, and the problems such as IR-drop and local overheating caused by narrow border or slim bezel are solved.

Figure 7:
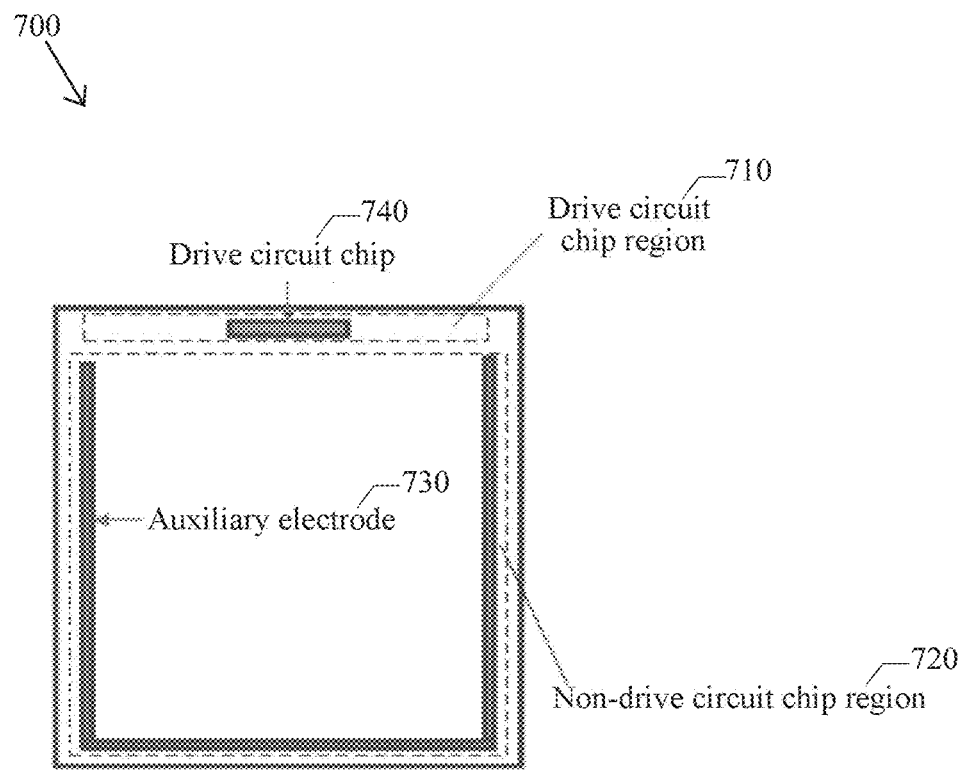
FIG. 7 illustrates a schematic top view of an auxiliary electrode according to another arrangement of the present disclosure.

Moreover, the display panel structure adopted in this arrangement also can prevent failure of encapsulation, due to a crack of the thin-film encapsulation layer which is caused by laser cutting and then extends into the encapsulation. FIG. 7 illustrates a schematic top view of an auxiliary electrode 730. As can be seen from FIG. 7, the display panel 700 includes a drive circuit chip region 710 and a non-drive circuit chip region 720. A drive circuit chip 740 is disposed in the drive circuit chip region 710. The auxiliary electrode 730 is arranged deviating from the drive circuit chip region 710 and encircles the display panel 700 by 270°. This is equivalent to a fact that a metal protection layer is arranged in the non-drive circuit chip region 720 of the display panel 700. When a crack of the thin-film encapsulation layer is caused by laser cutting the display panel 700, the crack will not further extend due to arrangement of the auxiliary electrode 730, and thus protection of the thin-film encapsulation of the display panel 700 is achieved.

In this arrangement, when the above display panel structure (e.g., the display panel 700) is used, there is a wider range of selecting materials of the top electrode and the lead wire of the top electrode. When the electroluminescent diode is of a top-emission type, the top electrode and the lead wire of the top electrode may be made from transparent metal oxide materials such as indium tin oxide (ITO) or indium zinc oxide (IZO), or may adopt ITO-Ag-ITO laminated materials. However, using these transparent materials is mainly to satisfy light transmittance, but may not necessarily match the performance function of the organic light emitting layer. More preferably, metallic materials such as metallic aluminium better matching the performance function of the organic light emitting layer may be selected as the materials of the top electrode and the lead wire of the top electrode in this arrangement. Aluminium is not high in light transmittance. However, in the display panel structure of the present disclosure, due to the presence of a parallel structure, on the premise of maintaining a lower overall resistance, the metallic aluminium may be made thinner than usual, and the effect of the parallel structure may offset or compensate size thinning of the top electrode and the lead wire of the top electrode.

The inventive concept of the present disclosure is also applicable to the case in which the electroluminescent diode is of a bottom-emission type. For the bottom-emission electroluminescent diode, it is unnecessary to take the light transmittance of the top electrode into account. In such a case, metal better matching the performance function of the light emitting layer of the electroluminescent diode than the ITO may be selected as the material of the lead wire of the top electrode.

Figure 8:
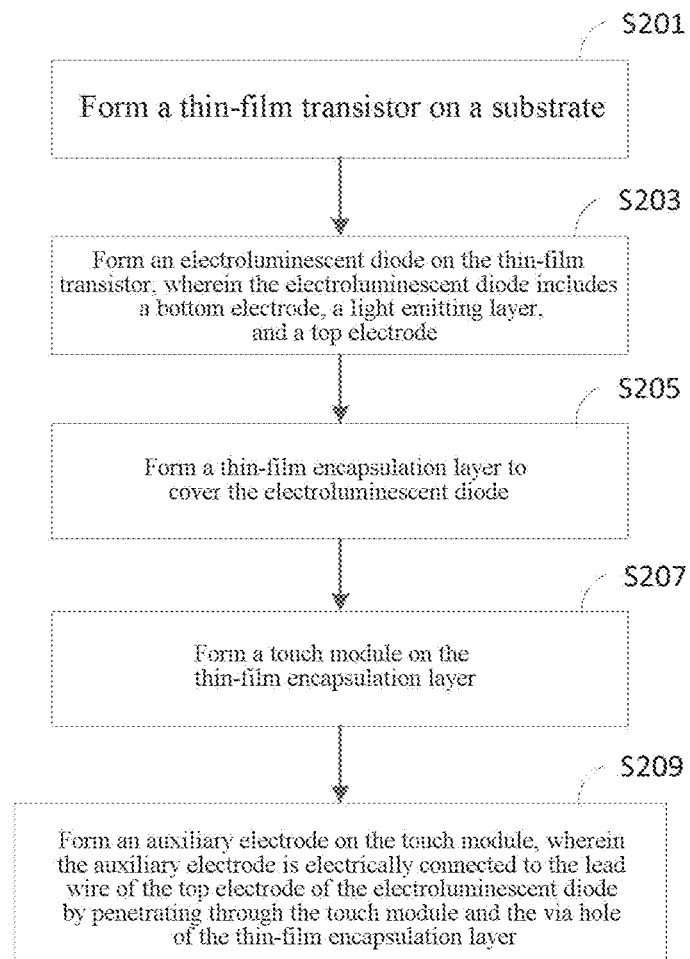
FIG. 8 illustrates a flowchart of preparing a display panel according to another arrangement of the present disclosure.

In a solution where a display panel has an internally-installed touch structure, as shown in FIG. 8, another arrangement of the present disclosure provides a method for manufacturing a display panel, which includes following blocks.

In S201, a thin-film transistor is formed on a substrate.

In S203, an electroluminescent diode is formed on the thin-film transistor. The electroluminescent diode includes a bottom electrode, a light emitting layer, and a top electrode.

In S205, a thin-film encapsulation layer is formed to cover the electroluminescent diode.

In one example, S201-S205 are the same as S101-S105, and the description concerning S201-S205 is thus omitted for brevity.

In S207, a touch module is formed on the thin-film encapsulation layer.

In S209, an auxiliary electrode is formed on the touch module and is electrically connected to the lead wire of the top electrode of the electroluminescent diode by penetrating through the touch module and the via hole of the thin-film encapsulation layer.

Figure 9:
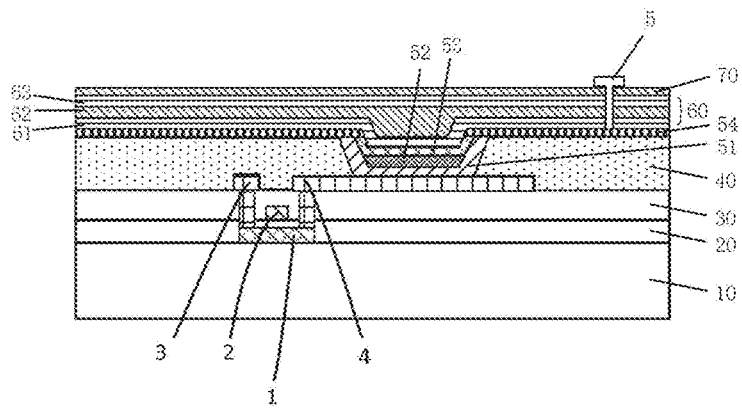
FIG. 9 illustrates a sectional view of a display panel according to another arrangement of the present disclosure.

In one example, as shown in FIG. 9, for a display panel of an electroluminescent device having an internally-installed touch structure, particularly for a display panel having an in-cell touch structure, forming a touch module 70 on the third inorganic thin-film encapsulation layer 63 by using a conventional process is similar to the forgoing arrangement. That is, first the touch module, the first inorganic thin-film encapsulation layer, the second organic thin-film encapsulation layer and the third inorganic thin-film encapsulation layer in the non-display area of the display panel are etched by using a mask to form the via hole penetrating through the touch module, the first inorganic thin-film encapsulation layer, the second organic thin-film encapsulation layer and the third inorganic thin-film encapsulation layer. Next, a metal layer is formed on the touch module by using a chemical vapor deposition (CVD) process. The metal layer may be prepared by using a metallic material such as ITO or Ti/Al/Ti. Finally the metal layer is etched by using the mask to form an auxiliary electrode 5. The auxiliary electrode 5 is electrically connected to the lead wire of the top electrode of the electroluminescent diode through the via hole.

The display panel as shown in FIG. 9 is obtained through the above processing blocks, the display panel includes:

a thin-film transistor arranged on a substrate;

an electroluminescent diode arranged on the thin-film transistor, which includes a bottom electrode, a light emitting layer, and a top electrode; and a thin-film encapsulation layer 60 covering the electroluminescent diode.

The display panel further includes the touch module 70 formed on the thin-film encapsulation layer. An auxiliary electrode 5 is arranged on the touch module and is electrically connected to the lead wire of the top electrode of the electroluminescent diode by penetrating through the touch module and the via hole of the thin-film encapsulation layer.

Compared with the preceding arrangements, for the display panel having an in-cell touch structure in this arrangement, the auxiliary electrode is arranged on the touch module and is electrically connected to the lead wire of the top electrode of the electroluminescent diode by penetrating through the touch module and the via hole of the first thin-film encapsulation layer, the second thin-film encapsulation layer and the third thin-film encapsulation layer to reduce the overall resistance and power consumption of the top electrode and the lead wire of the top electrode, to improve the display effect, and to solve the problems of IR-drop and local overheating caused by narrow bezel.

Moreover, the display panel structure adopted in this arrangement also can prevent failure of encapsulation due to a crack of the thin-film encapsulation layer caused by laser cutting extending into the encapsulation. FIG. 7 illustrates a schematic top view of an auxiliary electrode 730. As can be seen from FIG. 7, the display panel 700 includes a drive circuit chip region 710 and a non-drive circuit chip region 720. A drive circuit chip 740 is disposed in the drive circuit chip region 710. The auxiliary electrode 730 is arranged deviating from the drive circuit chip region 710 and encircles the display panel 700 by 270°. This is equivalent to a fact that a metal protection layer is arranged in the non-drive circuit chip region 720 of the display panel 700. When a crack of the thin-film encapsulation layer is caused by laser cutting the display panel 700, the crack will not further extend due to arrangement of the auxiliary electrode 730, and thus protection of the thin-film encapsulation of the display panel 700 is achieved.

Those skilled in the art should understand that the preferred implementations in the first arrangement and the consequent beneficial effects are also applicable to this arrangement, and thus the same portions are omitted herein.

Figure 10:
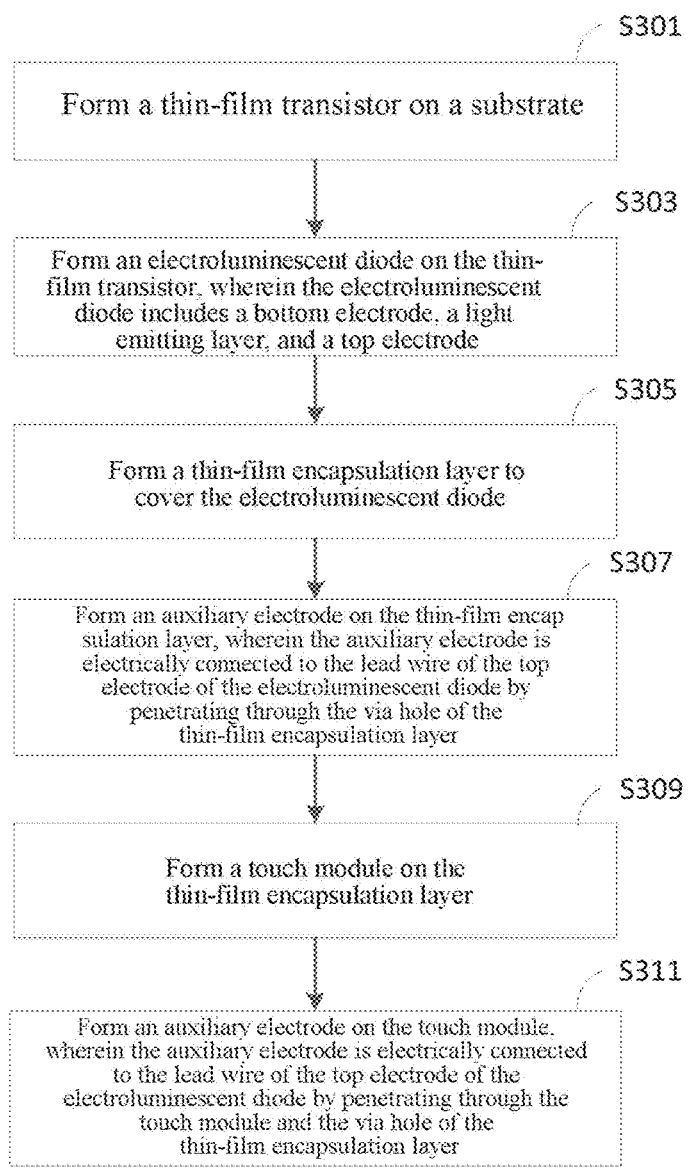
FIG. 10 illustrates a flowchart of preparing a display panel according to another arrangement of the present disclosure.

Still in the solution where the display panel has the internally-installed touch structure, to further reduce the overall resistance of the top electrode and the lead wire of the top electrode, as shown in FIG. 10, another arrangement of the present disclosure provides a method for manufacturing a display panel, which includes following blocks.

In S301, a thin-film transistor is formed on a substrate.

In S303, an electroluminescent diode is formed on the thin-film transistor. The electroluminescent diode includes a bottom electrode, a light emitting layer, and a top electrode.

In S305, a thin-film encapsulation layer is formed to cover the electroluminescent diode.

In S307, an auxiliary electrode is formed on the thin-film encapsulation layer. The auxiliary electrode is electrically connected to the lead wire of the top electrode of the electroluminescent diode by penetrating through the via hole of the thin-film encapsulation layer.

In S309, a touch module is formed on the thin-film encapsulation layer.

In S311, another auxiliary electrode is formed on the touch module. This auxiliary electrode is electrically connected to the lead wire of the top electrode of the electroluminescent diode by penetrating through the touch module and the via hole of the thin-film encapsulation layer.

Figure 11:
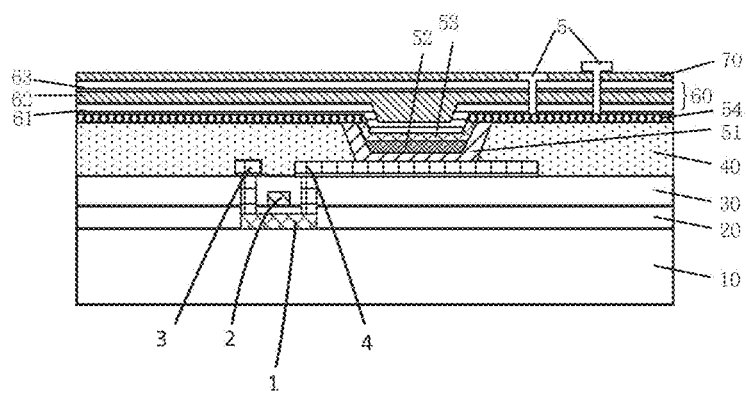
FIG. 11 illustrates a sectional view of a display panel according to another arrangement of the present disclosure.

In one example, for the display panel having an in-cell touch structure, the above two arrangements may be combined, and the fabrication processes are similar to the above arrangements, and thus are omitted herein. The display panel as shown in FIG. 11 is obtained through the above processing blocks. The display panel includes:

a thin-film transistor arranged on a substrate;

an electroluminescent diode arranged on the thin-film transistor, which includes a bottom electrode, a light emitting layer, and a top electrode; and a thin-film encapsulation layer covering the electroluminescent diode.

The display panel includes two auxiliary electrodes.

One auxiliary electrode is arranged on the thin-film encapsulation layer and is electrically connected to the lead wire of the top electrode of the electroluminescent diode by penetrating through the via hole of the thin-film encapsulation layer.

The display panel further includes a touch module formed on the thin-film encapsulation layer. The other auxiliary electrode is formed on the touch module and is electrically connected to the lead wire of the top electrode of the electroluminescent diode by penetrating through the touch module and the via hole of the thin-film encapsulation layer.

In one example, as shown in FIG. 11, for the display panel having the touch structure on the built-in unit, the above two arrangements may be combined. That is, the display panel includes two auxiliary electrodes. One auxiliary electrode is arranged on the thin-film encapsulation layer and is electrically connected to the lead wire of the top electrode of the electroluminescent diode by penetrating through the via hole of the thin-film encapsulation layer. The display panel further includes a touch module formed on the thin-film encapsulation layer. The other auxiliary electrode is formed on the touch module and is electrically connected to the lead wire of the top electrode of the electroluminescent diode by penetrating through the touch module and the via hole of the first thin-film encapsulation layer, the second thin-film encapsulation layer and the third thin-film encapsulation layer.

In such a case, the display panel is electrically connected to the lead wire of the top electrode of the electroluminescent diode by means of two auxiliary electrodes. This is equivalent to a fact that two longitudinal parallel resistors are additionally provided, such that the overall resistance and power consumption of the top electrode and the lead wire of the top electrode are further reduced compared with the above two arrangements, the display effect is improved, and the problems of IR-drop and local overheating caused by narrow bezel are solved.

Moreover, the display panel structure adopted in this arrangement also can prevent failure of encapsulation due to a crack of the thin-film encapsulation layer caused by laser cutting extending into the encapsulation. FIG. 7 illustrates a schematic top view of an auxiliary electrode. As can be seen from FIG. 7, the display panel includes a drive circuit chip region and a non-drive circuit chip region. The auxiliary electrode is arranged deviating from the drive circuit chip region and encircles the display panel by 270°. This is equivalent to a fact that a metal protection layer is arranged in the non-drive circuit chip region of the display panel. When a crack of the thin-film encapsulation layer is caused by laser cutting the display panel, the crack will not further extend due to arrangement of the auxiliary electrode, and thus protection of the thin-film encapsulation of the display panel is achieved.

Those skilled in the art should understand that the preferred implementations in the first arrangement and the consequent beneficial effects are also applicable to this arrangement, and thus the same portions are omitted herein. Based on the teachings provided by the above arrangements of the present disclosure, those skilled in the art can appreciate that the following display panel and the manufacturing method thereof are also within the scope of protection of the present disclosure.

A display panel includes: a thin-film transistor arranged on a substrate; an electroluminescent diode arranged on the thin-film transistor, including a bottom electrode, a light emitting layer, and a top electrode; and a thin-film encapsulation layer covering the electroluminescent diode. The display panel further includes an auxiliary electrode, which is electrically connected to a lead wire of the top electrode of the electroluminescent diode by penetrating through a via hole of the thin-film encapsulation layer.

A method for manufacturing a display panel includes:

forming a thin-film transistor on a substrate; forming an electroluminescent diode on the thin-film transistor, the electroluminescent diode including a bottom electrode, a light emitting layer, and a top electrode; forming a thin-film encapsulation layer to cover the electroluminescent diode; and forming an auxiliary electrode, the auxiliary electrode being electrically connected to a lead wire of the top electrode of the electroluminescent diode by penetrating through a via hole of the thin-film encapsulation layer.

Another arrangement of the present disclosure provides a display device, which includes the display panel provided by the above arrangement. The display device may be any product or component having a display function, such as an OLED panel, a mobile phone, a tablet computer, a TV set, a display, a notebook computer, a digital photo frame, a navigation device and so on.

Terms "one" and "another" used in the arrangements of the present disclosure are merely indicative but not restrictive. That is, "one" and "another" may be singular or may be plural. Those skilled in the art may understand that "one" and "another" are merely intended for describing a location where an auxiliary electrode can be arranged, and the technical solution of the present disclosure also may be applied to a structure with a plurality of auxiliary electrodes. Those skilled in the art may design the number and locations of the auxiliary electrodes according to actual needs, which is not repeated any more herein for the sake of brevity.

Apparently, the above arrangements of the present disclosure are only the examples for illustrating clearly the present disclosure and should not be interpreted as any limitations to the arrangements of the present disclosure. Various variations or modifications in different forms can be made for those of ordinary skills in the art based on the above description. Here all of the arrangements cannot be provided exhaustively. Obvious variations or modifications derived from the technical solution of the present disclosure still fall within the protection scope of the present disclosure.

What is claimed is:

1. A display panel, comprising:
a substrate;
a thin-film transistor arranged on the substrate;
an electroluminescent diode arranged on the thin-film transistor, comprising a bottom electrode, a light emitting layer, and a top electrode; and a thin-film encapsulation layer covering the electroluminescent diode; wherein
the display panel further comprises an auxiliary electrode, and the auxiliary electrode is electrically connected to a lead wire of the top electrode of the electroluminescent diode by penetrating through a via hole of the thin-film encapsulation layer,
wherein the thin-film encapsulation layer comprises a first inorganic thin-film encapsulation layer, a second organic thin-film encapsulation layer and a third inorganic thin-film encapsulation layer arranged in a direction away from the electroluminescent diode.

2. The display panel according to claim 1, further comprising a touch module formed on the thin-film encapsulation layer, wherein the auxiliary electrode is formed on the touch module and is electrically connected to the lead wire of the top electrode of the electroluminescent diode by penetrating through the touch module and the via hole of the thin-film encapsulation layer.

3. The display panel according to claim 1, comprising two auxiliary electrodes, wherein
one of the auxiliary electrodes is arranged on the thin-film encapsulation layer and is electrically connected to the lead wire of the top electrode of the electroluminescent diode by penetrating through the via hole of the thin-film encapsulation layer; and
the display panel further comprises a touch module formed on the thin-film encapsulation layer, and another of the auxiliary electrodes is formed on the touch module and is electrically connected to the lead wire of the top electrode of the electroluminescent diode by penetrating through the touch module and the via hole of the thin-film encapsulation layer.

4. The display panel according to claim 1, wherein
the electroluminescent diode is of a top-emission type, and a material of the lead wire of the top electrode is one of indium tin oxide (ITO), an ITO-Ag-ITO laminated layer, and
metal smaller than the ITO in light transmittance but better matching a performance function of the light emitting layer of the electroluminescent diode.

5. The display panel according to claim 1, wherein
the electroluminescent diode is of a bottom-emission type, and the material of the lead wire of the top electrode is metal better matching the performance function of the light emitting layer of the electroluminescent diode than the indium tin oxide (ITO).

6. The display panel according to claim 1, wherein a material of the auxiliary electrode is ITO or a Ti—Al—Ti laminated layer.

7. The display panel according to claim 1, comprising a drive circuit chip region, wherein the auxiliary electrode is arranged deviating from the drive circuit chip region and encircles the display panel by 270°.

8. A display device, comprising:
a display panel, wherein the display panel comprises:
a substrate;
a thin-film transistor arranged on the substrate;
an electroluminescent diode arranged on the thin-film transistor, comprising a bottom electrode, a light emitting layer, and a top electrode; and
a thin-film encapsulation layer covering the electroluminescent diode; wherein
the display panel further comprises an auxiliary electrode, and the auxiliary electrode is electrically connected to a lead wire of the top electrode of the electroluminescent diode by penetrating through a via hole of the thin-film encapsulation layer,
wherein the thin-film encapsulation layer comprises a first inorganic thin-film encapsulation layer, a second organic thin-film encapsulation layer and a third inorganic thin-film encapsulation layer arranged in a direction away from the electroluminescent diode.

9. A method for manufacturing a display panel, comprising:
forming a thin-film transistor on a substrate;
forming an electroluminescent diode on the thin-film transistor, the electroluminescent diode comprising a bottom electrode, a light emitting layer, and a top electrode;
forming a thin-film encapsulation layer to cover the electroluminescent diode; and
forming an auxiliary electrode, the auxiliary electrode being electrically connected to a lead wire of the top electrode of the electroluminescent diode by penetrating through a via hole of the thin-film encapsulation layer,
wherein the thin-film encapsulation layer comprises a first inorganic thin-film encapsulation layer, a second organic thin-film encapsulation layer and a third inorganic thin-film encapsulation layer arranged in a direction away from the electroluminescent diode.

10. The method according to claim 9, wherein after forming the thin-film encapsulation layer, the method comprises:
forming a touch module on the thin-film encapsulation layer, and
the forming an auxiliary electrode comprises: forming the auxiliary electrode on the touch module so that the auxiliary electrode is electrically connected to the lead wire of the top electrode of the electroluminescent diode by penetrating through the touch module and the via hole of the thin-film encapsulation layer.

11. The method according to claim 9, wherein the forming the auxiliary electrode comprises:
forming the auxiliary electrode on the thin-film encapsulation layer, the auxiliary electrode being electrically connected to the lead wire of the top electrode of the electroluminescent diode by penetrating through the via hole of the thin-film encapsulation layer;
after forming the auxiliary electrode, the method comprises:
forming a touch module on the thin-film encapsulation layer; and
forming another auxiliary electrode on the touch module, the another auxiliary electrode being electrically connected to the lead wire of the top electrode of the electroluminescent diode by penetrating through the touch module and the via hole of the thin-film encapsulation layer.

12. The method according to claim 9, wherein
the electroluminescent diode is of a top-emission type, and a material of the lead wire of the top electrode is one of indium tin oxide (ITO), an ITO-Ag-ITO laminated layer, and a metal smaller than the ITO in light transmittance but better matching a performance function of the light emitting layer of the electroluminescent diode.

13. The method according to claim 9, wherein the electroluminescent diode is of a bottom-emission type, and a material of the lead wire of the top electrode is a metal better matching the performance function of the light emitting layer of the electroluminescent diode than indium tin oxide (ITO).

* * * * *